United States Patent
Campbell et al.

(10) Patent No.: US 7,286,351 B2
(45) Date of Patent: Oct. 23, 2007

(54) APPARATUS AND METHOD FOR FACILITATING COOLING OF AN ELECTRONICS RACK EMPLOYING A CLOSED LOOP HEAT EXCHANGE SYSTEM

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 11/124,525

(22) Filed: May 6, 2005

(65) Prior Publication Data

US 2006/0250770 A1    Nov. 9, 2006

(51) Int. Cl.
*H05K 7/20* (2006.01)
(52) U.S. Cl. .............. 361/696; 165/80.4; 165/185; 361/695; 454/184
(58) Field of Classification Search ........... 361/696, 361/701
See application file for complete search history.

(56) References Cited

U.S. PATENT DOCUMENTS

| | | | |
|---|---|---|---|
| 3,317,798 A * | 5/1967 | Chu et al. ............ | 361/696 |
| 3,754,596 A | 8/1973 | Ward, Jr. ............. | 165/107 |
| 5,467,609 A * | 11/1995 | Feeney ................ | 62/259.2 |
| 5,767,690 A * | 6/1998 | Fujimoto ............. | 324/760 |
| 6,374,267 B1 * | 4/2002 | Tam .................... | 707/204 |
| 6,374,627 B1 | 4/2002 | Schumacher et al. ... | 62/259.2 |

(Continued)

FOREIGN PATENT DOCUMENTS

JP      2002-374086      12/2002

(Continued)

OTHER PUBLICATIONS

Arent, et al., "Liquid Coolant Distribution Unit with Convertible Air or Water Cooling," IBM Research Disclosure No. 24631, Kenneth Mason Publications Ltd., (Oct. 1984) 1 pg.

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti P.C.

(57) ABSTRACT

Apparatus and method are provided for facilitating cooling of an electronics rack employing a closed loop heat exchange system. The closed loop heat exchange system includes a first heat exchanger, a second heat exchanger, and a coolant distribution loop connecting the first heat exchanger and the second heat exchanger. When operational, the coolant distribution loop allows coolant to circulate between the first heat exchanger and the second heat exchanger. The closed loop heat exchange system couples to the electronics rack with the first heat exchanger disposed at an air inlet side of the electronics rack, and the first heat exchanger and the second heat exchanger disposed in different inlet-to-outlet air flow paths through the electronics rack to reduce an imbalance in air flow temperature of the different inlet-to-outlet air flow paths through the electronics rack.

20 Claims, 9 Drawing Sheets

U.S. PATENT DOCUMENTS

| | | | |
|---|---|---|---|
| 6,574,104 B2 * | 6/2003 | Patel et al. | 361/695 |
| 6,628,520 B2 | 9/2003 | Patel et al. | 361/696 |
| 6,672,955 B2 | 1/2004 | Charron | 454/184 |
| 6,745,579 B2 | 6/2004 | Spinazzola et al. | 62/89 |
| 6,775,137 B2 | 8/2004 | Chu et al. | 361/696 |
| 6,819,563 B1 | 11/2004 | Chu et al. | 361/696 |
| 6,886,353 B2 * | 5/2005 | Patel et al. | 62/180 |
| 7,133,283 B2 * | 11/2006 | Faneuf et al. | 361/689 |
| 7,184,267 B2 * | 2/2007 | Patel | 361/692 |
| 2004/0008483 A1 | 1/2004 | Cheon | 361/687 |

OTHER PUBLICATIONS

"The Liebert Rack Cooler", Internet search printout (Aug. 2, 2004), 3 pgs.

Patel, et al., "Computational Fluid Dynamics Modeling of High Compute Density Data Centers to Assure System Inlet Air Specifications," Proceedings of IPACK'01 (IPACK2001-15622), (Jul. 2001), 9 pgs.

Chu, et al., "Air Flow System and Method for Facilitating Cooling of Stacked Electronics Components," U.S. Appl. No. 10/828,787, filed Apr. 21, 2004.

* cited by examiner

APPARATUS AND METHOD FOR FACILITATING COOLING OF AN ELECTRONICS RACK EMPLOYING A CLOSED LOOP HEAT EXCHANGE SYSTEM

TECHNICAL FIELD OF THE INVENTION

The present invention relates in general to apparatuses and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations not only will the room air conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature or in a reduction in long term reliability of the components.

Thus, there is a need in the art for an apparatus and method for facilitating balanced cooling of rack-mounted electronic units, particularly in the context of a large computer installation.

SUMMARY OF THE INVENTION

The shortcomings of the prior art are overcome and additional advantages are provided through an apparatus for facilitating cooling of an electronics rack. The apparatus includes a closed loop heat exchange system. The closed loop heat exchange system includes a first exchanger, a second heat exchanger, and a coolant distribution loop connecting the first heat exchanger and the second heat exchanger. When operational, the coolant distribution loop allows coolant to circulate between the first heat exchanger and the second heat exchanger. The closed loop heat exchange system couples to the electronics rack with the first heat exchanger disposed at an air inlet side of the electronics rack, and the first heat exchanger and the second heat exchanger disposed in different inlet-to-outlet air flow paths through the electronics rack to reduce an imbalance in an air flow temperature of the different inlet-to-outlet air flow paths.

In another aspect, a cooled electronics system is provided. The cooled electronics system includes an electronics rack having an air inlet side and an air outlet sides, at least one electronics drawer, and at least one air moving device. The air inlet and air outlet side respectively enable ingress and egress of external air, while the at least one air moving device is capable of causing external air to flow from the air inlet side of the electronics rack across the at least one electronics drawer to the air outlet side of the electronics rack. The cooled electronics system further includes a closed loop heat exchange system coupled to the electronics rack. The closed loop heat exchange system includes a first heat exchanger, a second heat exchanger, and a coolant distribution loop connecting the first heat exchanger and the second heat exchanger. When operational, the coolant distribution loop allows coolant to circulate between the first heat exchanger and the second heat exchanger. The closed loop heat exchange system is coupled to the electronics rack with the first heat exchanger disposed at the air inlet side of the electronics rack, and with the first heat exchanger and the second heat exchanger disposed in different inlet-to-outlet air flow paths through the electronics rack to reduce an imbalance in an air flow temperature of the different inlet-to-outlet air flow paths through the electronics rack.

In a further aspect, a method for facilitating cooling of an electronics rack is provided. This method includes providing a closed loop heat exchange system connected to the electronics rack. The closed loop heat exchange system includes a first heat exchanger, a second heat exchanger, and a coolant distribution loop connecting the first heat exchanger and the second heat exchanger. When operational, the coolant distribution loop allows coolant to circulate between the first heat exchanger and the second heat exchanger. The closed loop heat exchange system is connected to the electronics rack with the first heat exchanger disposed at an air inlet side of the electronics rack, and with the first heat exchanger and the second heat exchanger disposed in different inlet-to-outlet air flow paths through the electronics rack to reduce an imbalance in air flow temperature of the different air flow paths through the electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers each having one or more heat generating components disposed therein requiring cooling. Further, as used herein, "heat exchanger" means any heat exchange mechanism through which coolant of a closed loop system such as described herein can circulate; and includes, one or more discrete heat exchange devices coupled either in series or in parallel. A heat exchange device may comprise, for example, one or more coolant flow paths, formed of thermally conductive tubing (such as copper or other tubing) in thermal or mechanical contact with a plurality of air cooled cooling fins. Additionally, size, configuration and construction of the first heat exchanger and/or second heat exchanger described herein below can vary without departing from the scope of the present invention.

Reference is now made to the drawings, which are not drawn to scale for reasons of understanding, wherein the same reference numbers used throughout different figures designate the same or similar components.

Figure 1A:
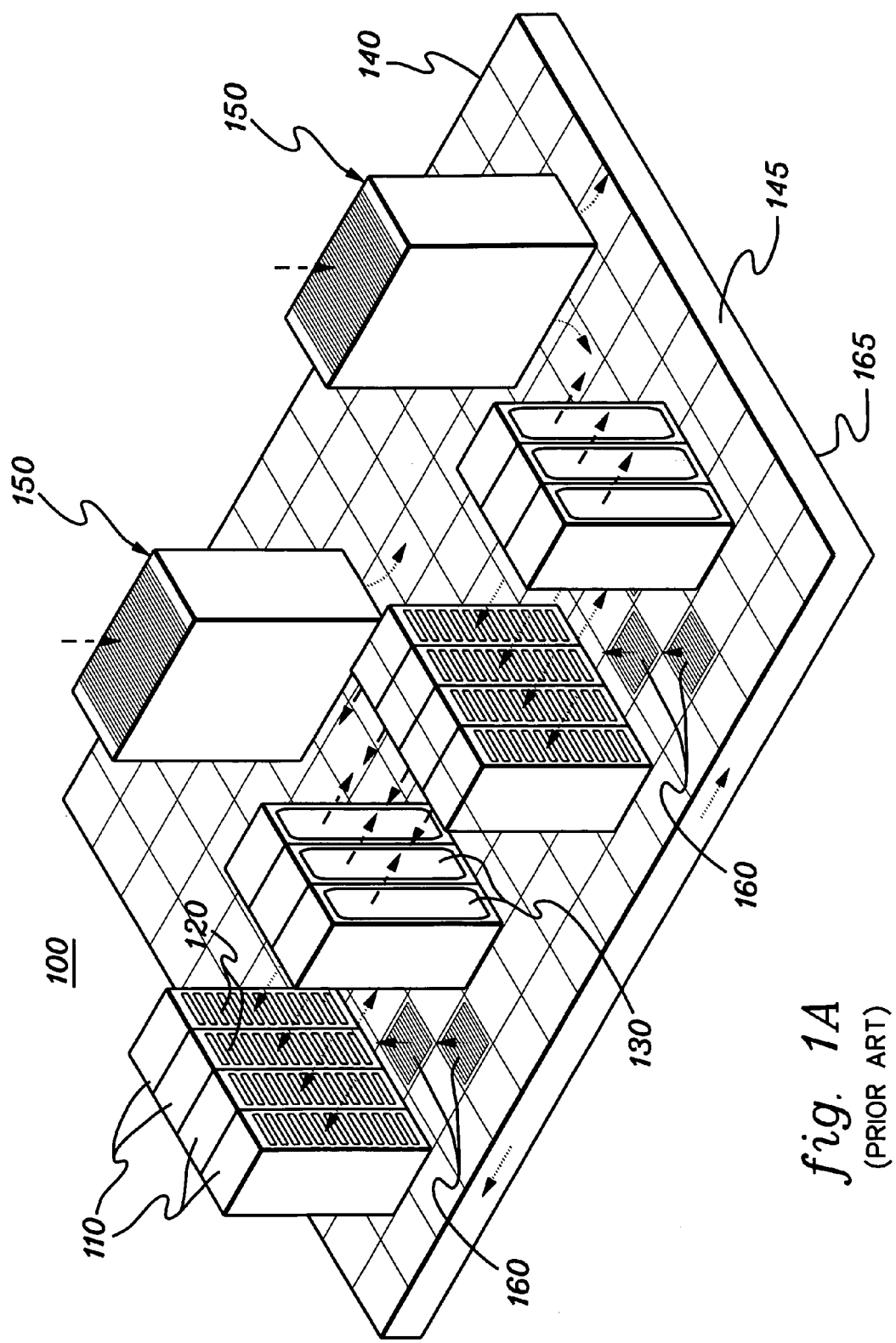
FIG. 1A depicts one embodiment of a conventional raised floor layout of an air cooled computer installation.

As shown in FIG. 1A, in a raised floor layout of an air cooled computer installation 100 typical in the prior art, multiple electronics racks 110 are disposed in one or more rows. A computer installation such as depicted in FIG. 1A may house several hundred, or even several thousand microprocessors. In the arrangement of FIG. 1A, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 1B:
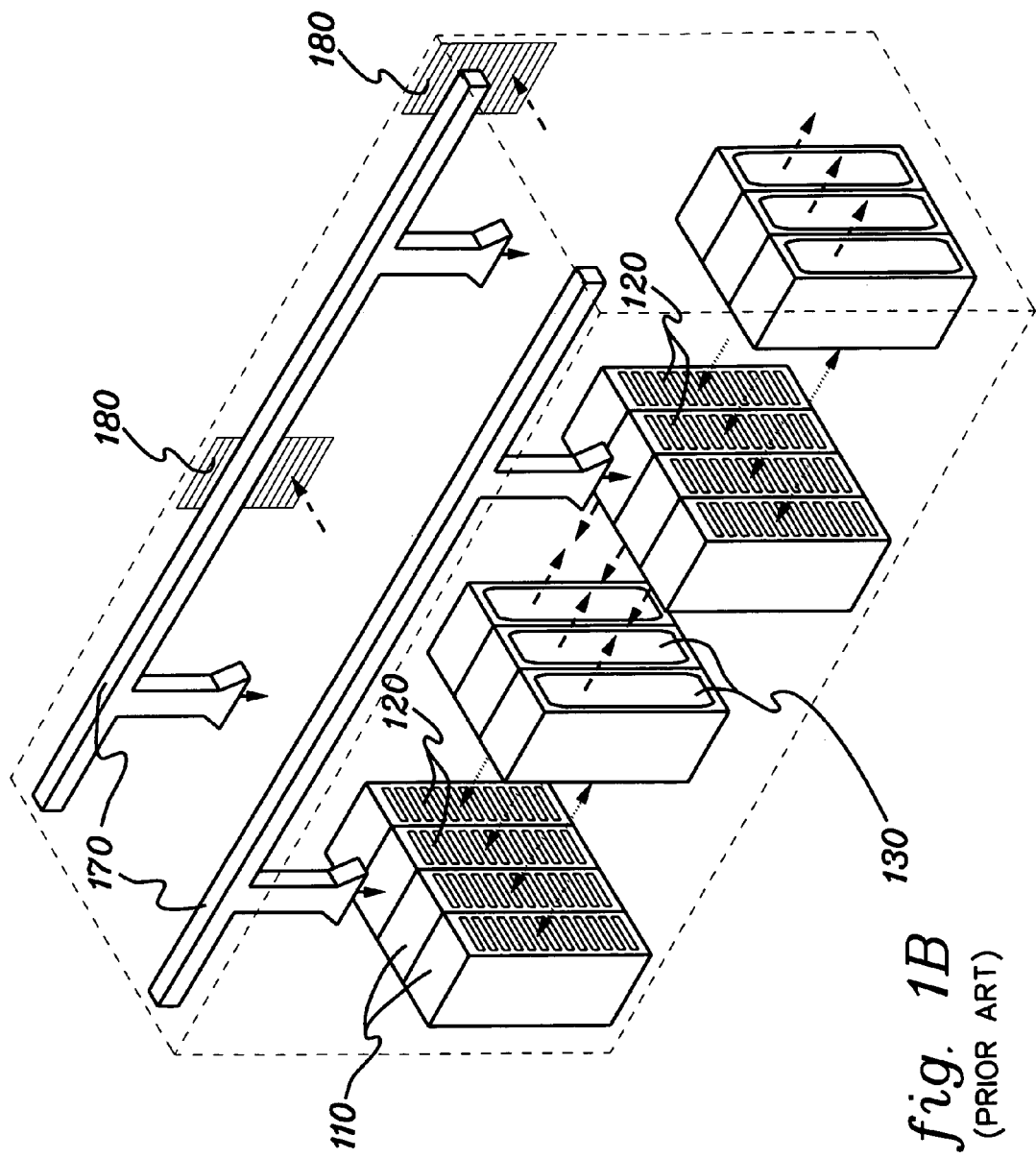
FIG. 1B depicts one embodiment of a conventional non-raised floor layout of an air cooled computer installation, wherein overhead air ducts and diffusers are employed in distributing cooled air flow to the electronics racks.

FIG. 1B depicts an alternate computer room configuration wherein multiple electronics racks 110 disposed in rows are cooled via conditioned and cooled air entering the room from overhead ducts and diffusers 170. Air exits the room via vents 180 that may be placed at different locations within the room. The ducts and diffusers 170 are disposed so as to align to the cold aisle of the multiple rows and provide cooled air to the air inlet sides 120 of the electronics racks. Air moving devices within the racks move the cooled air through the racks from their inlet-to-outlet sides to cool the heat generating components therein. Heated air is again exhausted at the hot aisles of the racks through the air outlet sides 130 of electronics racks 110. In one embodiment, returns 180 can be aligned to the hot aisles defined by the opposing air exhaust sides 130 of the electronics racks.

Figure 2:
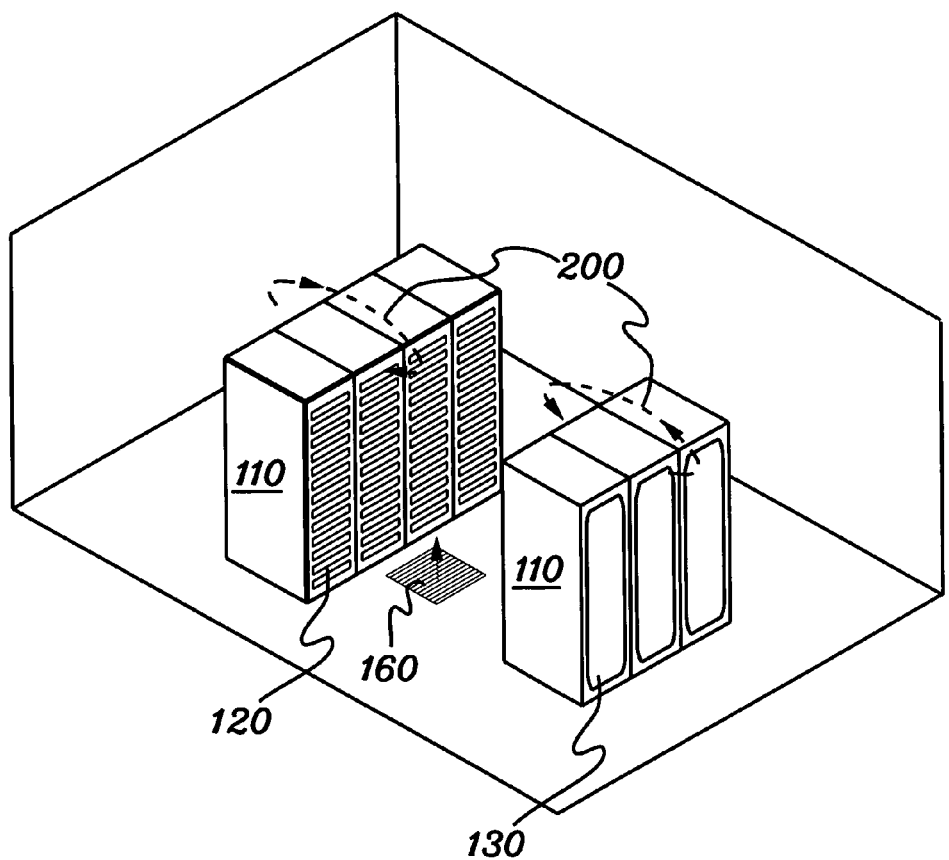
FIG. 2 depicts one problem addressed by the present invention, showing recirculation air flow patterns in one implementation of a raised floor layout of an air cooled computer installation.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 10-35° C. range. For a raised floor layout such as depicted in FIG. 1A, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is of significant importance, from a product reliability and performance view point, and from a customer satisfaction and business perspective, to limit the temperature of the inlet air to the rack unit to be within a desirable range, i.e., from a lower portion of the air inlet side to an upper portion of the air inlet side. The efficient cooling of such computer and electronic systems, and the amelioration of localized hot air inlet temperatures to one or more rack units due to recirculation of air currents, are addressed by the apparatuses and methods disclosed herein.

Figure 3A:
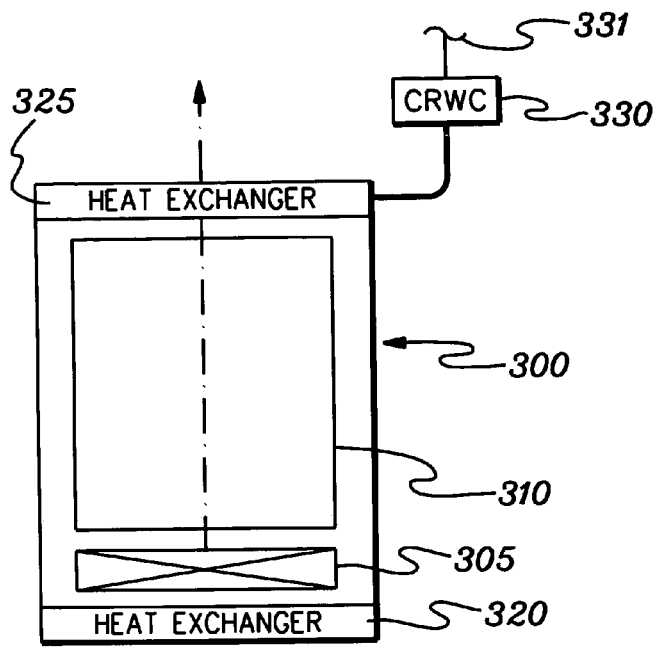
FIG. 3A is a cross-sectional plan view of one embodiment of electronics rack using facility chilled liquid-to-air heat exchangers to enhance cooling of air passing through the electronics rack.
Figure 3B:
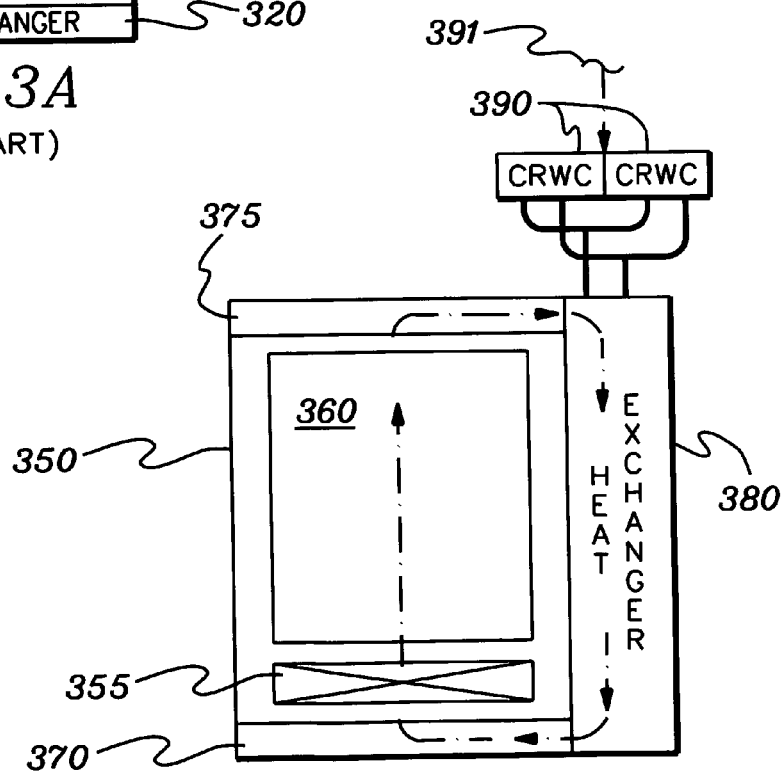
FIG. 3B is a cross-sectional plan view of another embodiment of an electronics rack using facility chilled liquid-to-air heat exchangers to enhance cooling of air passing though the electronics racks.

FIGS. 3A and 3B depict prior rack level water cooled solutions which utilize chilled facility water to remove heat from the computer installation room, thereby transferring the cooling burden from the air-conditioning units to the building chilled water coolers. The embodiment of FIG. 3A is described in detail in commonly assigned U.S. Pat. No. 6,819,563, while the embodiment of FIG. 3B is described in detail in commonly assigned U.S. Pat. No. 6,775,137, both of which are incorporated herein by reference in their entirety. Briefly summarized, both embodiments utilize a computer room water conditioning unit 330 (FIG. 3A), 390 (FIG. 3B) (fed with facility chilled water 331 (FIG. 3A), 391 (FIG. 3B)), which circulates chilled coolant through one or more heat exchangers coupled to individual electronics racks 300, 350 within the computer room.

In the embodiment of FIG. 3A, electronics rack 300 has an inlet heat exchanger 320 and/or an outlet heat exchanger 325 coupled to the rack. Air flow across one or more electronics drawers 310 is forced via one or more air moving devices 305. Each heat exchanger 320, 325 covers the complete air flow paths from front to back, with the air intake being chilled by heat exchanger 320, and the heated exhaust chilled by heat exchanger 325. Thus, the inlet-to-outlet air flow paths through the rack unit each pass through the same sequence of heat exchangers.

In FIG. 3B, rack unit 350 again includes one or more air moving devices 355 for moving air flow from an air inlet side to an air outlet side across one or more drawer units 360 containing the heat generating components. In this embodiment, a front cover 370 covers the air inlet side, a back cover covers the air outlet side of the rack unit, and a side car includes a heat exchanger 380 for cooling of the air circulating through the rack unit. Further, in this embodiment, multiple computer room water conditioning (CRWC) units 390 receive building or facility chilled water 391, which is then used to cool coolant circulating through heat exchanger 380. The rack unit in this example is assumed to comprise a substantially enclosed housing wherein the same air circulates through the housing and passes across the heat exchanger 380.

Note that the cooling techniques illustrated in FIGS. 3A and 3B, and described in the above-referenced United States Letters Patent, each utilize utility or building chilled water. There are many "dry" data centers that do not have access to building chilled water for the purpose of computer system cooling. Further, the techniques depicted in FIGS. 3A and 3B do not explicitly address, or necessarily solve, the problem of localized over heating of the air temperature at the inlet of the rack unit. The present invention, in one aspect, solves this problem of localized air over heating, and is particularly beneficial where building chilled water is not available for facilitating cooling of the electronics racks. The concepts disclosed herein can be used in conjunction with devices such as shown in FIGS. 3A and 3B, where there occurs a large air temperature differential between different portions of the air inlet side of the electronics rack. Further, the concepts disclosed herein lead to energy gains by more efficiently using the chilled conditioned air commonly used in today's air cooled data centers.

Figure 4A:
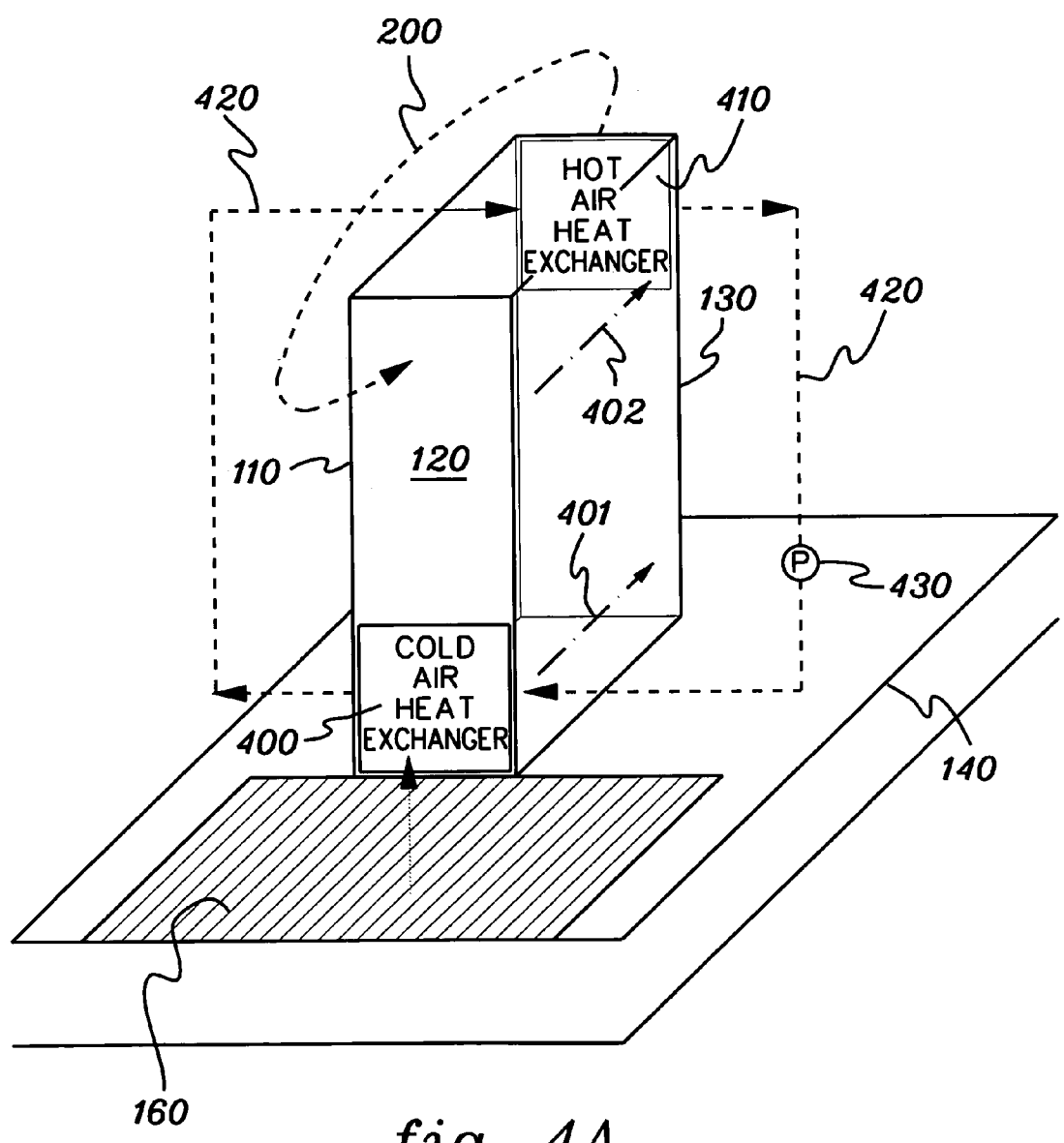
FIG. 4A depicts one embodiment of electronics rack disposed on a raised floor of a computer installation, and employing a closed loop heat exchange system coupled to the rack in one configuration, in accordance with an aspect of the present invention.

FIG. 4A depicts one embodiment of a closed loop heat exchange system in accordance with an aspect of the present invention. This system is designed to enhance cooling of a rack unit in a raised floor computer room installation, such as depicted in FIG. 1A. The system includes two liquid-to-air heat exchangers 400, 410, which are connected via a closed liquid or refrigerant loop 420. Loop 420 may be passive or active (e.g., via pump 430) with respect to the driving force for coolant motion through the closed loop. As shown, cold air heat exchanger 400 is disposed at a lower portion of the air inlet side 120 of electronics rack 110, while the second, hot air heat exchanger 410 is disposed at an upper portion of the air outlet side 130 of electronics rack 110. In the embodiment of FIG. 4A, hot exhaust air is blown through the heat exchanger 410 by one or more air moving devices within the electronics rack. This hot exhaust air heats up the coolant (liquid of refrigerant) in the hot air heat exchanger 410, after which the coolant travels (e.g., via a pump 430) to the cold air heat exchanger 400 disposed in the lower portion of the air inlet side 120 of the electronics rack, where the coolant is cooled by the chilled air entering the electronics rack from the one or more perforated floor tiles 160 in the cold aisle of the raised floor 140. Since in the configuration of FIG. 4A, the hot air heat exchanger 410 is higher than the cold air heat exchanger 400 of the closed loop heat exchange system, a driving force for coolant flow within the system would be desirable. For example, pump 430, or a compressor, a looped heat pipe system, or a pulsed heat pipe system could be employed as the coolant moving device.

Figure 6:
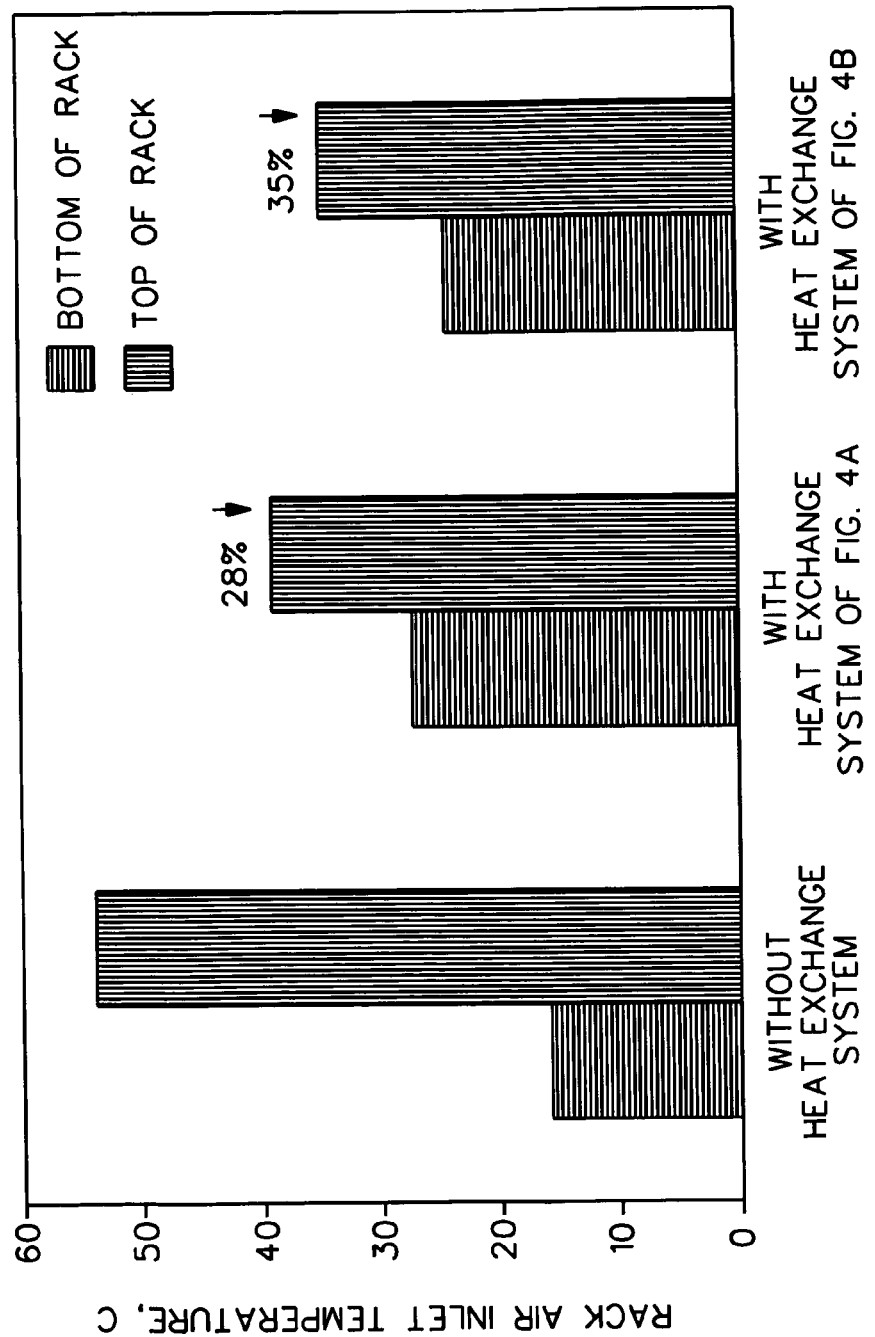
FIG. 6 is a graph of electronics rack air inlet temperature for lower and upper portions of the electronics rack, without air flow temperature balancing, with air flow temperature balancing using a closed loop heat exchange system configured as depicted in FIG. 4A, and with air flow temperature rebalancing using a closed loop heat exchange system configured as depicted in FIG. 4B, in accordance with an aspect of the present invention.

The results described below in connection with FIG. 6 show that the apparatus of FIG. 4A is effective in redistributing the rack heat load, evening the temperature differences, and thus enabling higher rack cooling and greater computer installation cooling efficiency. This is achieved by lowering the exhaust temperature at the upper portion of the air outlet side 130 of the electronics rack. By lowering this exhaust temperature, the typical hot air recirculation 200 occurs at a lower temperature, thus reducing the imbalance in air flow temperature between different inlet-to-outlet air flow paths 401, 402 through the electronics rack.

Significant to the closed loop heat exchange system described herein is that the cold air heat exchanger and the hot air heat exchanger are not disposed in the same inlet-to-outlet air flow path through the electronics rack. This is desirable in order to achieve an optimal chilled air redistribution to reduce the imbalance in air flow temperature through the electronic rack. Those skilled in the art will note, however, that the portions over which the cold air heat exchanger overlies the air inlet side and the hot air heat exchanger overlies the air outlet side can vary, provided that there is little or no overlap from a direct air inlet to air outlet path. For example, the cold air heat exchanger could overlie the lower 50% of the air inlet side of the electronics rack, while the hot air heat exchanger could overlie the upper 50% of the air outlet side of the electronics rack. Alternatively, the cold air heat exchanger could overlie two thirds of the air inlet side 120 of the electronics rack, while the hot air heat exchanger could overlie the upper one third of the air outlet side 130 of the electronics rack. Other variations are also possible without departing from the scope of the present invention.

Figure 4B:
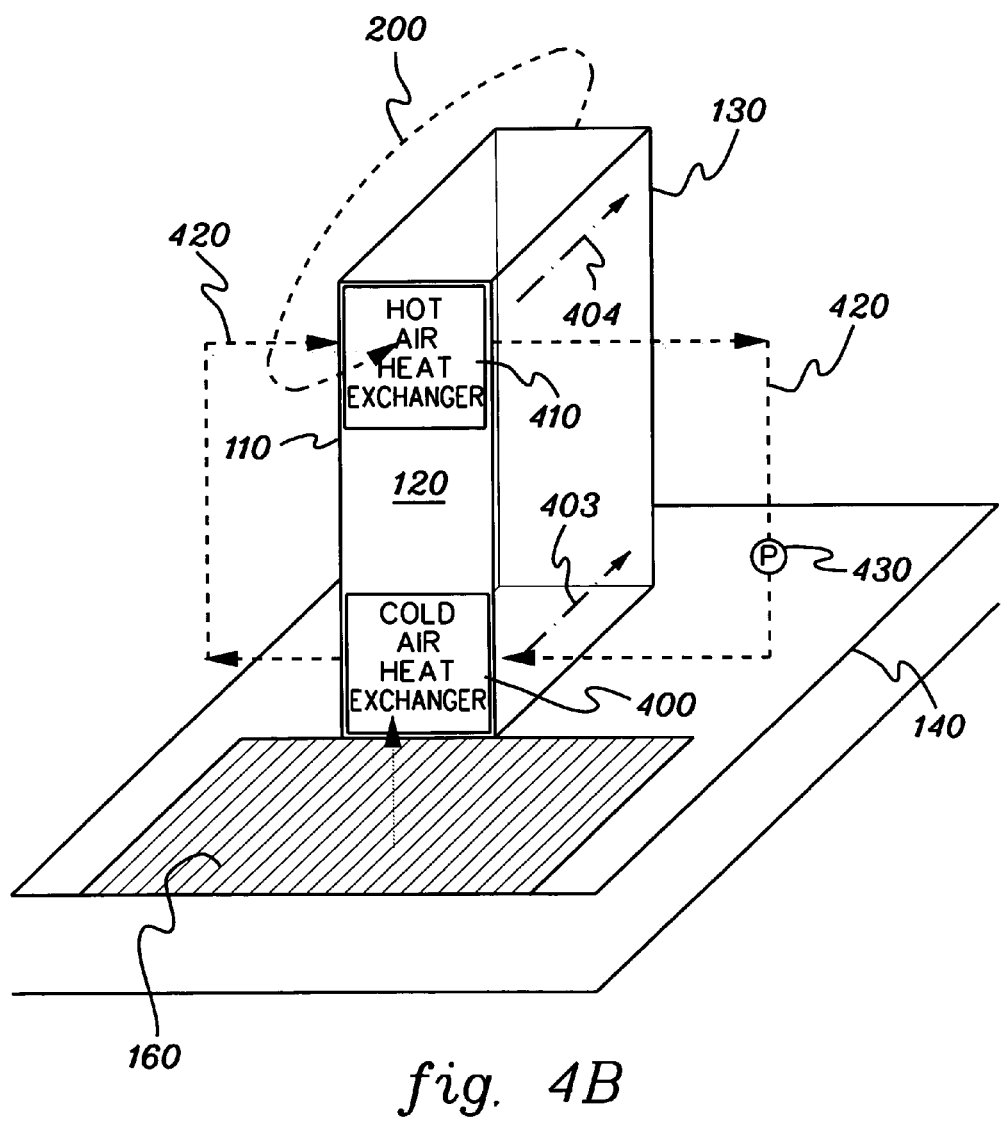
FIG. 4B depicts the electronics rack of FIG. 4A, with the closed loop heat exchange system coupled to the electronics rack in an alternate configuration, in accordance with an aspect of the present invention.

FIG. 4B depicts an alternate configuration of a closed loop heat exchange system in accordance with an aspect of the present invention. In this implementation, both cold air heat exchanger 400 and hot air heat exchanger 410 overlie a portion of the air inlet side 120 of the electronics rack 110. This again is a raised floor computer installation implementation where recirculated air 200 is assumed to travel from the air outlet side 130 of the electronics rack back to the air inlet side 120 of the rack. Thus, in accordance with this implementation, chilled air supply via the perforated floor tiles 160 in the raised floor 140 cools coolant passing through cold air heat exchanger 400, and is actively forced to hot air heat exchanger 410 through appropriate coolant distribution loops 420 via, for example, a pump 430 (or other coolant driver such as a compressor, looped heat pipe system, or pulsed heat pipe system).

The chilled coolant via hot air heat exchanger 410 cools the intake air, including the recirculated air 200, at the upper portion of the air inlet side of the electronics rack, thereby reducing the imbalance of in air flow temperature between an air flow 403 through the lower portion of the electronics rack and an air flow 404 through an upper portion of the electronics rack. As with the heat exchange system embodiment of FIG. 4A, cold air heat exchanger 400 and hot air heat exchanger 410 are disposed in different inlet-to-outlet air flow paths 403, 404 through the electronics rack. Further, as noted above, the sizing, configuration and construction of the different heat exchange devices making up heat exchangers 400, 410 can vary, provided that the heat exchangers are in different inlet-to-outlet air flow paths from front to back of the electronics rack. Thus, the cold air heat exchanger 400 could overlie the lower 50% of the air inlet side of the electronics rack, and the hot air heat exchanger could overlie the upper 50% of the air inlet side of the electronics rack. Other variations are also possible without departing from the scope of the present invention.

Figure 5A:
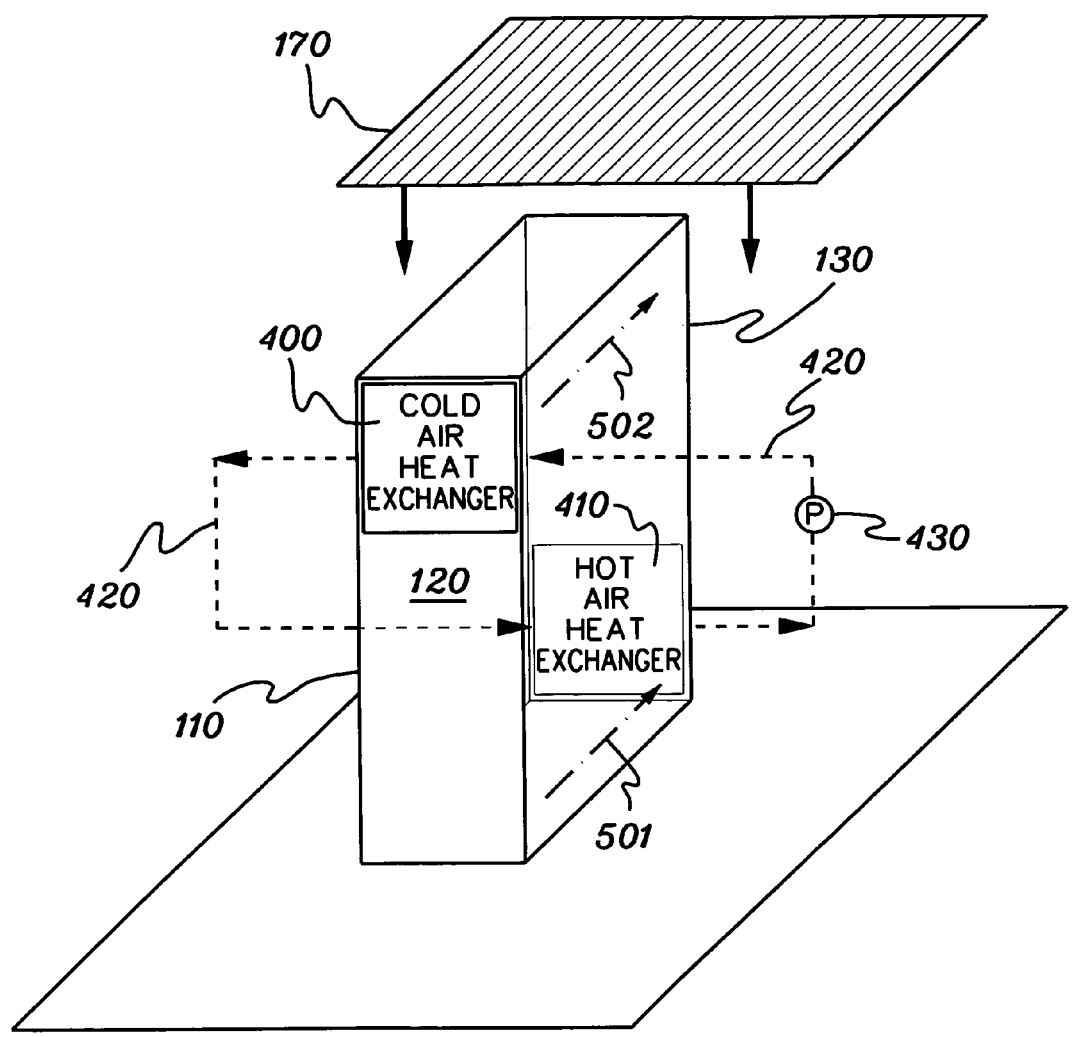
FIG. 5A depicts one embodiment of electronics rack disposed on a non-raised floor of a computer installation with cooled air supplied from overhead, and employing a closed loop heat exchange system coupled to the rack in one configuration, in accordance with an aspect of the present invention.
Figure 5B:
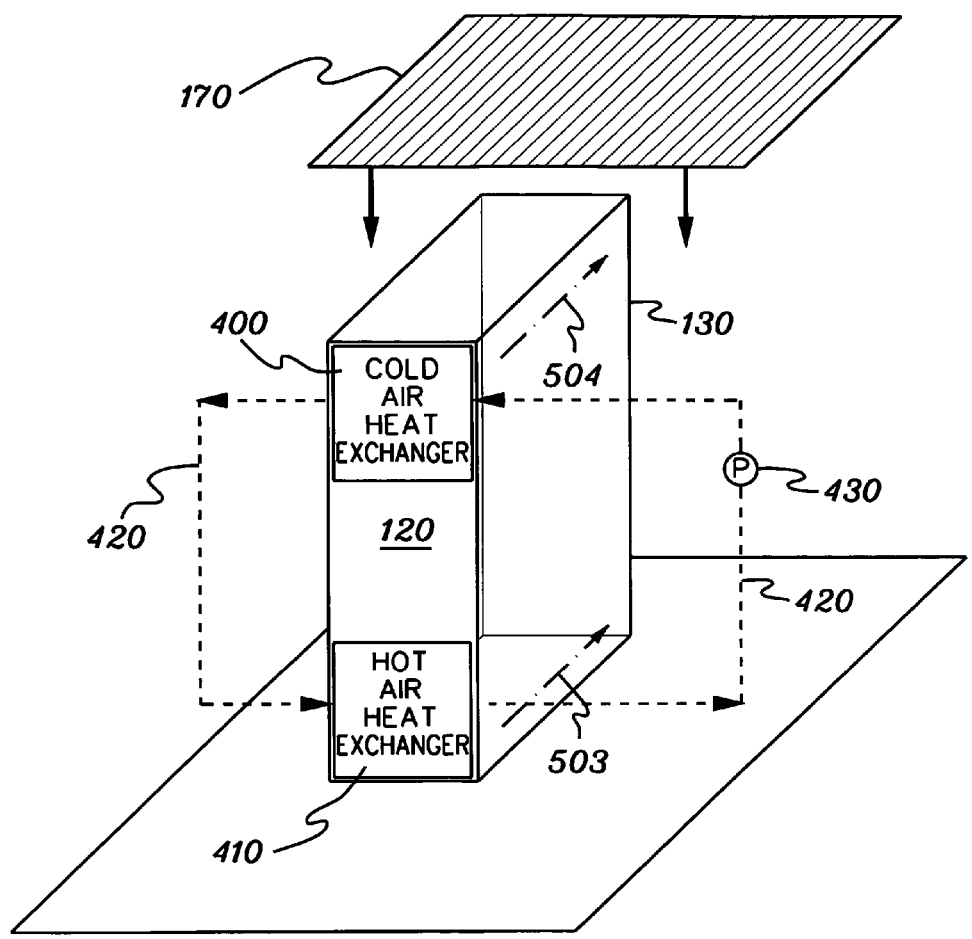
FIG. 5B depicts the electronics rack of FIG. 5A, showing the closed loop heat exchange system coupled to the electronics rack in an alternate configuration, in accordance with an aspect of the present invention.

FIGS. 5A and 5B depict further alternate embodiments of a closed loop heat exchange system, in accordance with an aspect of the present invention. These alternate embodiments assume the existence of a computer installation with conditioned and cooled air supplied through over head ducts and appropriate diffusers 170 (i.e., a non-raised floor installation). In the implementation of FIG. 5A, cold air heat exchanger 400 overlies an upper portion of the air inlet side 120 of electronics rack 110, while hot air heat exchanger 410 overlies a lower portion of the air outlet side 130 of the rack. Thus, the cold air heat exchanger and hot air heat exchanger are disposed in different inlet-to-outlet air flow paths 502, 501, respectively. The closed loop heat exchange system further includes coolant distribution loops 420 coupling the heat exchangers to allow coolant to circulate between the heat exchangers in a closed loop manner. Depending on the implementation, a passive coolant circulating technique (such as a thermosiphon) or a coolant moving device (such as pump 430) may be optionally employed.

FIG. 5B depicts a further alternate embodiment wherein cold air heat exchanger 400 and hot air heat exchanger 410 both overlie a portion of the air inlet side 120 of the electronics rack, with cold air heat exchanger 400 in the upper portion, and hot air heat exchanger 410 in the lower portion. As noted above, the size, configuration and construction of the heat exchange devices making up each heat exchanger 400, 410 can vary, provided that the heat exchangers are disposed in distinct inlet-to-outlet air flow paths of the electronics rack (i.e., the heat exchangers have little or no inlet-to-outlet overlap on the air inlet side and/or air outlet side of the rack unit). The closed loop system again includes a coolant distribution loop 420, and in this embodiment, an optional coolant moving device 430.

A representative data center system was modeled using commercially available modeling software, and data generated from the analysis is depicted in FIG. 6. The model employed constituted a quarter symmetry section of a sixteen rack raised floor data center, with each rack unit possessing a 20 kW heat load, and with 60% of the rack blower air supply being supplied via the perforated floor tiles in the raised floor (i.e., chilled air at 15° C.). The room layout was arranged in a cold aisle hot aisle fashion as depicted in FIG. 1A. The results show a substantial temperature difference of about 38° C. in a typical data center environment (i.e., without the closed loop heat exchange system disclosed herein). This temperature difference is reduced to 11-12° C. with a closed loop heat exchange system, such as presented herein. While the rack unit inlet air temperatures range from 16-54° C. without the use of the closed loop heat exchange system, with the system, this range is reduced to 27-39° C. and 24-35° C. for the embodiments illustrated in FIGS. 4A and 4B, respectively. This is a significant reduction in the maximum rack air inlet temperature of 28% and 35%, respectively, for the embodiments of FIGS. 4A and 4B.

Although preferred embodiments have been depicted and described in detail herein, it will be apparent to those skilled in the relevant art that various modifications, additions, substitutions, and the like can be made without departing from the spirit of the invention and that these are therefore considered to be within the scope of the invention as defined in the following claims.

What is claimed is:

1. Apparatus for facilitating cooling of an electronics rack, the apparatus comprising:
   a closed loop heat exchange system comprising:
      a first heat exchanger, a second heat exchanger, and a coolant distribution loop connecting the first heat exchanger and the second heat exchanger, the coolant distribution loop allowing coolant to circulate between the first heat exchanger and the second heat exchanger; and
      wherein the closed loop heat exchange system couples to the electronics rack with the first heat exchanger disposed at an air inlet side of the electronics rack, and the first heat exchanger and the second heat exchanger disposed in different inlet-to-outlet air flow paths through the electronics rack to reduce an imbalance in air flow temperature of the different air flow paths through the electronics rack.

2. The apparatus of claim 1, wherein the second heat exchanger is disposed at one of an air outlet side of the electronics rack or the air inlet side of the electronics rack, and wherein the electronics rack includes at least one air moving device for moving air from the air inlet side of the electronics rack to the air outlet side of the electronics rack.

3. The apparatus of claim 2, wherein a cooled air supply is provided to the air inlet side of the electronics rack through a perforated floor tile, and wherein the first heat exchanger is disposed at a lower portion of the air inlet side of the electronics rack.

4. The apparatus of claim 3, wherein the second heat exchanger is disposed at one of an upper portion of the air outlet side of the electronics rack or an upper portion of the air inlet side of the electronics rack, wherein the first heat exchanger is a cold air heat exchanger and the second heat exchanger is a hot air heat exchanger, and wherein the closed loop heat exchange system reduces an imbalance in air flow temperature between an inlet-to-outlet air flow path in the lower portion of the electronics rack and an inlet-to-outlet air flow path in the upper portion of the electronics rack.

5. The apparatus of claim 2, wherein the closed loop heat exchange system further comprises a coolant moving device for actively moving coolant between the first heat exchanger and the second heat exchanger.

6. The apparatus of claim 1, wherein cooled air supply is provided to the air inlet side of the electronics through an air duct disposed above the electronics rack, and wherein the first heat exchanger is disposed at an upper portion of the air inlet side of the electronics rack.

7. The apparatus of claim 6, wherein the electronics rack further includes at least one air moving device for moving air from the air inlet side of the electronics rack to an air outlet side of the electronics rack, and wherein the second heat exchanger is disposed at one of a lower portion of the air outlet side of the electronics rack and a lower portion of the air inlet side of electronics rack, wherein the closed loop heat exchange system reduces an imbalance in air flow temperature between an inlet-to-outlet air flow path in the upper portion of the electronics rack and an inlet-to-outlet air flow path in the lower portion of the electronics rack.

8. The apparatus of claim 1, wherein when operational, cooled coolant flows from the first heat exchanger to the second heat exchanger and heated coolant flows from the second heat exchanger to the first heat exchanger, wherein temperature of a first inlet-to-outlet air flow path passing through the first heat exchanger is raised, and temperature of a second inlet-to-outlet air flow path passing through the second heat exchanger is lowered, thereby reducing the imbalance in air flow temperature between the first inlet-to-outlet air flow path and the second inlet-to-outlet air flow path.

9. A cooled electronics system comprising:
an electronics rack, the electronics rack having:
an air inlet side and an air outlet side, the air inlet and air outlet sides respectively enabling ingress and egress of external air;
at least one electronics drawer;
at least one air moving device, the at least one air moving device being capable of causing external air to flow from the air inlet side of the electronics rack, across the at least one electronics drawer to the air outlet side of the electronics rack;
a closed loop heat exchange system coupled to the electronics rack, the closed loop heat exchange system comprising:
a first heat exchanger, a second heat exchanger, and a coolant distribution loop connecting the first heat exchanger and the second heat exchanger, the coolant distribution loop allowing coolant to circulate between the first heat exchanger and the second heat exchanger; and
wherein the closed loop heat exchange system is coupled to the electronics rack with the first heat exchanger disposed at the air inlet side of the electronics rack, and the first heat exchanger and the second heat exchanger disposed in different inlet-to-outlet air flow paths through the electronics rack to reduce an imbalance in air flow temperature of the different air flow paths through the electronics rack.

10. The cooled electronics system of claim 9, wherein a cooled air supply is provided to the air inlet side of the electronics rack through a perforated floor tile, and wherein the first heat exchanger is disposed at a lower portion of the air inlet side of the electronics rack, and the second heat exchanger is disposed at one of an upper portion of the air outlet side of the electronics rack or an upper portion of the air inlet side of the electronics rack, wherein the first heat exchanger is a cold air heat exchanger and the second heat exchanger is a hot air heat exchanger, and wherein the closed loop heat exchange system reduces an imbalance in air flow temperature between an inlet-to-outlet air flow path in the lower portion of the electronics rack and an inlet-to-outlet air flow path in the upper portion of the electronics rack.

11. The cooled electronics system of claim 9, wherein the closed loop heat exchange system further comprises a coolant moving device for actively moving coolant between the first heat exchanger and the second heat exchanger.

12. The cooled electronics system of claim 9, wherein a cooled air supply is provided to the air inlet side of the electronics rack through an air duct disposed above the electronics rack, and wherein the first heat exchanger is disposed at an upper portion of the air inlet side of the electronics rack.

13. The cooled electronics system of claim 12, wherein the second heat exchanger is disposed at one of a lower portion of the air outlet side of the electronics rack or a lower portion of the air inlet side of the electronics rack, and wherein the closed loop heat exchange system reduces an imbalance in air flow temperature between an inlet-to-outlet air flow path in the upper portion of the electronics rack and an inlet-to-outlet air flow path in the lower portion of the electronics rack.

14. The cooled electronics system of claim 9, wherein when operational, cooled coolant flows from the first heat exchanger to the second heat exchanger and heated coolant flows from the second heat exchanger to the first heat exchanger, wherein temperature of a first inlet-to-outlet air flow path passing through the first heat exchanger is raised, and temperature of a second inlet-to-outlet air flow path passing through the second heat exchanger is lowered, thereby reducing the imbalance in air flow temperature between the first air flow path and the second air flow path.

15. The cooled electronics system of claim 9, wherein the first heat exchanger and the second heat exchanger differ by at least one of size, configuration, construction or number of heat exchange devices.

16. A method for facilitating cooling of an electronics rack, the method comprising:
providing a closed loop heat exchange system connected to the electronics rack, the closed loop heat exchange system comprising:
a first heat exchanger, a second heat exchanger, and a coolant distribution loop connecting the first heat exchanger and the second heat exchanger, the coolant distribution loop allowing coolant to circulate between the first heat exchanger and the second heat exchanger; and
wherein the closed loop heat exchange system is connected to the electronics rack with the first heat exchanger disposed at an air inlet side of the electronics rack, and the first heat exchanger and the second heat exchanger disposed in different inlet-to-outlet air flow paths through the electronics rack to reduce an imbalance in air flow temperature of the different air flow paths through the electronics rack.

17. The method of claim 16, wherein when a cooled air supply is to be provided to the air inlet side of the electronics rack through a perforated floor tile, the providing includes disposing the first heat exchanger at a lower portion of the air inlet side of the electronics rack, and disposing the second heat exchanger at one of an upper portion of an air outlet side of the electronics rack or an upper portion of the air inlet side of the electronics rack, and wherein the electronics rack further includes at least one air moving device for moving air from the air inlet side of the electronics rack to the air outlet side of the electronics rack, wherein the first heat exchanger is a cold air heat exchanger and the second heat exchanger is a hot air heat exchanger, and wherein the closed loop heat exchange system reduces an imbalance in air flow temperature between an inlet-to-outlet air flow path in the lower portion of the electronics rack and an inlet-to-outlet air flow path in the upper portion of the electronics rack.

18. The method of claim 16, wherein when a cooled air supply is to be provided to the air inlet side of the electronics rack through an air duct disposed above the electronics rack, the providing includes disposing the first heat exchanger at an upper portion of the air inlet side of the electronics rack.

19. The method of claim 18, wherein the electronics rack further includes at least one air moving device for moving air from the air inlet side of the electronics rack to an air outlet side of the electronics rack, and wherein the providing comprises disposing the second heat exchanger at one of a lower portion of the air outlet side of the electronics rack or a lower portion of the air inlet side of the electronics rack, wherein the closed loop heat exchange system reduces an imbalance in air flow temperature between an inlet-to-outlet air flow path in the upper portion of the electronics rack and an inlet-to-outlet air flow path in the lower portion of the electronics rack.

20. The method of claim 16, wherein when operational, cooled coolant flows from the first heat exchanger to the second heat exchanger and heated coolant flows from the second heat exchanger to the first heat exchanger, wherein temperature of a first inlet-to-outlet air flow path passing through the first heat exchanger is raised, and temperature of a second inlet-to-outlet air flow path passing through the second heat exchanger is lowered, thereby reducing the imbalance in air flow temperature between the first inlet-to-outlet air flow path and the second inlet-to-outlet air flow path.

* * * * *